US010237053B2

(12) United States Patent
Uehara

(10) Patent No.: US 10,237,053 B2
(45) Date of Patent: Mar. 19, 2019

(54) SEMICONDUCTOR DEVICE AND DATA SYNCHRONIZATION METHOD

(71) Applicant: LAPIS Semiconductor Co., Ltd., Yokohama (JP)

(72) Inventor: Teruaki Uehara, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 15/888,444

(22) Filed: Feb. 5, 2018

(65) Prior Publication Data

US 2018/0241539 A1 Aug. 23, 2018

(30) Foreign Application Priority Data

Feb. 23, 2017 (JP) .................................. 2017-032570

(51) Int. Cl.
*H03D 3/24* (2006.01)
*H04L 7/00* (2006.01)
*H03K 5/13* (2014.01)
*H04L 7/033* (2006.01)
*H03K 5/00* (2006.01)

(52) U.S. Cl.
CPC ............ *H04L 7/0037* (2013.01); *H03K 5/13* (2013.01); *H04L 7/0331* (2013.01); *H03K 2005/00019* (2013.01)

(58) Field of Classification Search
CPC ....... H04L 7/0037; H04L 7/0331; H03K 5/13; H03K 2005/00019
USPC ........................................................ 375/376
See application file for complete search history.

(56) References Cited

U.S. PATENT DOCUMENTS

| 5,533,072 | A  | * | 7/1996  | Georgiou ................ | H03M 9/00 327/141 |
| 5,896,052 | A  | * | 4/1999  | Gujral ...................... | G06F 1/04 327/144 |
| 6,031,886 | A  | * | 2/2000  | Nah ...................... | H04L 7/0338 370/516 |
| 6,987,825 | B1 | * | 1/2006  | Yoshimura ............. | H03K 5/135 327/144 |
| 8,581,654 | B2 | * | 11/2013 | Kim ...................... | H03H 11/16 327/291 |

(Continued)

FOREIGN PATENT DOCUMENTS

JP 2009-147869 A 7/2009

*Primary Examiner* — Helene Tayong
(74) *Attorney, Agent, or Firm* — Rabin & Berdo, P.C.

(57) ABSTRACT

A semiconductor device that receives input data synchronized with a first clock signal and generates output data synchronized with a second clock signal, includes a clock delay circuit that generates first and second delay clock signals, first and second synchronized retrieval circuits that respectively retrieve the input data at timings when each of logical values of the second clock signal and second delay clock signal being switched, to respectively obtain first and second retrieved data, and a clock value retrieval circuit that retrieves a value of the first clock signal at timings when the second clock signal and first delay clock signal respectively switch from the first logical value to the second logical value, to respectively output first and second clock values, and an output circuit that outputs, as the output data, the first or second retrieved data, depending on a value of the first and second clock values.

10 Claims, 7 Drawing Sheets

(56) References Cited

U.S. PATENT DOCUMENTS 9,356,610 B1\* 5/2016 Harayama ............... H04L 7/033
2012/0105113 A1\* 5/2012 Maeno ................ G06F 13/4217
327/151

\* cited by examiner

| CL1 | CL2 | CL3 | SEL |
|-----|-----|-----|-----|
| 0 | 0 | 0 | 0 |
| 0 | 0 | 1 | 0 |
| 0 | 1 | 1 | 1 |
| 1 | 1 | 1 | 1 |
| 1 | 1 | 0 | 1 |
| 1 | 0 | 0 | 1 |

FIG. 7

| STATE | CL1 | CL2 | CL3 | RETRIEVING DATA DT | | |
|---|---|---|---|---|---|---|
| | | | | CK2 | CK2a | CK2b |
| (a) | 0 | 0 | 0 | ○ | ○ | ○ |
| (b) | 0 | 0 | 0(1) | ○ | ○ | ● |
| (c) | 0 | 0 | 1(0) | ○ | ○ | ● |
| (d) | 0 | 0(1) | 1 | ○ | ● | ○ |
| (e) | 0 | 1(0) | 1 | ○ | ● | ○ |
| (f) | 0(1) | 1 | 1 | ● | ○ | ○ |
| (g) | 1(0) | 1 | 1 | ● | ○ | ○ |
| (h) | 1 | 1 | 1 | ○ | ○ | ○ |
| (i) | 1 | 1 | 1(0) | ○ | ○ | ○ |
| (j) | 1 | 1 | 0(1) | ○ | ○ | ○ |
| (k) | 1 | 1(0) | 0 | ○ | ○ | ○ |
| (l) | 1 | 0(1) | 0 | ○ | ○ | ○ |
| (m) | 1(0) | 0 | 0 | ○ | ○ | ○ |
| (n) | 0(1) | 0 | 0 | ○ | ○ | ○ |

0(1),1(0) : UNCERTAIN VALUE
0,1 : NORMAL VALUE

○ : RETRIEVING NORMAL VALUE
● : RETRIEVING UNCERTAIN VALUE

SEMICONDUCTOR DEVICE AND DATA SYNCHRONIZATION METHOD

BACKGROUND OF THE INVENTION

Technical Field

The present invention relates to a semiconductor device that synchronizes data, and to a data synchronization method.

Background Art

Currently, data processing circuits formed in semiconductor devices primarily have a clock synchronization design. Also, in recent years, in order to increase speed in and reduce energy consumption of such data processing circuits, there are cases in which various function modules constituting the data processing circuit operate on independent clock signals that are not synchronized to each other. For example, if an output signal generated by a first function module that operates on a first clock signal is to be transmitted to a second function module that operates on a second clock signal, then a flip-flop (hereinafter abbreviated as "FF") included in the second function module retrieves the output signal in synchronization with the second clock signal.

However, in order for the FF to correctly retrieve the inputted data, a data change stoppage period (setup time, hold time) in which data must be maintained at a given value (a logical value of 0 or 1) at approximately the time of the rising edge or falling edge of the clock signal. If the inputted data value changes during the data change stoppage period, then so-called metastability occurs in which there is oscillation in the output of the FF over a given period, resulting in an uncertain output value. If metastability occurs, then the output from the FF after the given period stabilizes, but the outputted value is not necessarily the same as the inputted data value, and thus, a defect occurs in which the inputted data is not correctly transmitted to a later stage FF.

Thus, when directly transmitting data between function modules operating with asynchronous clock signals, a metastability defect may occur in the FF of the reception-side function module.

In order to eliminate such defects resulting from metastability, a synchronization circuit including a first FF that retrieves data at the rising edge of the clock signal and a second FF that retrieves data at the falling edge of the clock signal has been proposed (see Japanese Patent Application Laid-Open Publication No. 2009-147869, for example). In this synchronization circuit, the output signal of the first FF or the output signal of the second FF is selected as described below, and the selection results are retrieved by a third FF according to the timing of the clock signal and then outputted. In other words, a determination is made as to whether or not the inputted data value is the same as the value of the output signal of the first FF, and if so, the output signal of the first FF is selected, whereas if the values differ from each other, the output signal of the second FF is selected. That is, if the value of the inputted data differs from the value of the output signal outputted from the first FF, then the value of the data changes during the above-mentioned data change stoppage period, and a metastability defect occurs in the output of the first FF. In this case, the output result of the second FF, among the output results of the first and second FFs, is selected and then outputted through the third FF.

SUMMARY OF THE INVENTION

However, in the above-mentioned configuration for a synchronization circuit, if the frequency of the clock signal at the data transmission source (referred to as the first clock signal) is higher than the clock signal used in the synchronization circuit (referred to as the second clock signal), cases arise in which the fluctuation period of the data is shorter than the period of the second clock signal. As a result, in such a case, results of determining whether or not the value of the inputted data matches the value of the output signal from the first FF depends on changes in the inputted data value regardless of whether or not a metastability has occurred. Thus, in a case where the frequency of the first clock signal at the data transmission source is higher than that of the second clock signal, the above-mentioned conventional synchronization circuit could not be used.

An object of the present invention is to provide a semiconductor device and a data synchronization method by which it is possible to synchronize data that was synchronized to a first clock signal, to a second clock signal that is asynchronous to the first clock signal and at a differing frequency therefrom, without causing defects caused by metastability.

According to an aspect of the invention, a semiconductor device is configured to receive input data synchronized with a first clock signal, and generate output data synchronized with a second clock signal, each of the first clock signal and the second clock signal having a first logical value and a second logical value alternately repeated. The semiconductor device includes a clock delay circuit configured to generate a first delay clock signal by delaying the second clock signal by a first delay time, the first delay clock signal having the first logical value and the second logical value alternately repeated, and a second delay clock signal by delaying the first delay clock signal by a second delay time, the second delay clock signal having the first logical value and the second logical value alternately repeated. The semiconductor device further includes a first synchronized retrieval circuit configured to retrieve the input data at a timing when a value of the second clock signal switches from the first logical value to the second logical value, to thereby obtain first retrieved data. A second synchronized retrieval circuit is configured to retrieve the input data at a timing when a value of the second delay clock signal switches from the first logical value to the second logical value, to thereby obtain second retrieved data. A clock value retrieval circuit is configured to retrieve a value of the first clock signal at a timing when the second clock signal switches from the first logical value to the second logical value, to thereby output a first clock value, and a value of the first clock signal at a timing when the first delay clock signal switches from the first logical value to the second logical value, to thereby output a second clock value. An output circuit is configured to output, as the output data that is synchronized with the second clock signal, the first retrieved data when the first clock value and the second clock value are both the first logical value, and the second retrieved data when at least one of the first clock value and the second clock value is the second logical value.

According to another aspect of the invention, a semiconductor device includes a clock delay circuit configured to generate a first delay clock signal by delaying the second clock signal by a first delay time, the first delay clock signal having the first logical value and the second logical value alternately repeated, and a second delay clock signal by delaying the first delay clock signal by a second delay time, the second delay clock signal having the first logical value and the second logical value alternately repeated. This semiconductor device also includes first synchronized retrieval circuit configured to retrieve the input data at a timing when a value of the second clock signal switches from the first logical value to the second logical value, to thereby obtain first retrieved data, and a second synchronized retrieval circuit configured to retrieve the input data at a timing when a value of the second delay clock signal switches from the first logical value to the second logical value, to thereby obtain second retrieved data. A clock value retrieval circuit retrieves a value of the first clock signal at a timing when the second clock signal switches from the first logical value to the second logical value, to thereby output a first clock value, and a value of the first clock signal at a timing when the first delay clock signal switches from the first logical value to the second logical value, to thereby output a second clock value. An output circuit outputs, as the output data that is synchronized with the second clock signal, one of the first retrieved data and the second retrieved data, depending on values of the first clock value and the second clock value.

According to another aspect of the invention, a data synchronization method for synchronizes input data, that is synchronized with a first clock signal, to a second clock signal, each of the first clock signal and the second clock signal having a first logical value and a second logical value alternately repeated. The method includes generating a first delay clock signal by delaying the second clock signal by a first delay time, and generating a second delay clock signal by delaying the first delay clock signal by a second delay time, each of the first delayed clock signal and the second delayed clock signal having the first logical value and the second logical value that are alternately repeated, retrieving the input data at a timing when the second clock signal switches from the first logical value to the second logical value, to thereby obtain first retrieved data, retrieving the input data at a timing when the second delay clock signal switches from the first logical value to the second logical value, to thereby obtain second retrieved data, attaining a value of the first clock signal at a timing when the second clock signal switches from the first logical value to the second logical value, to thereby obtain a first clock value, attaining a value of the first clock signal at a timing when the first delay clock signal switches from the first logical value to the second logical value, to thereby obtain a second clock value, and outputting, as the synchronized data that is synchronized with the second clock signal, the first retrieved data when the first clock value and the second clock value are both the first logical value, and the second retrieved data when at least one of the first clock value and the second clock value is the second logical value.

In the invention, when synchronizing the input data, which was synchronized to the first clock signal, to the second clock signal, the value of the first clock signal is attained as a first clock value when the second clock signal switches from the first logical value to the second logical value, and the value of the first clock signal is attained as a second clock value when the first delay clock signal, which is formed by delaying the second clock signal by a first delay time (first prescribed time), switches from the first logical value to the second logical value. Furthermore, the input data is retrieved as first retrieved data when the second clock signal switches from the first logical value to the second logical value, and the input data is retrieved as second retrieved data when the second delay clock signal, which is formed by delaying the second clock signal by double the prescribed time (a second delay time), switches from the first logical value to the second logical value.

At this time, if the first clock value and the second clock value both indicate the first logical value, then the time at which the first clock signal switches from the first logical value to the second logical value is always a prescribed time or more away from the time at which the second clock signal switches from the first logical value to the second logical value. In other words, at this time, the first retrieved data retrieved according to the second clock signal has not undergone metastability, and thus, data attained by synchronizing the first retrieved data to the second clock signal is outputted as synchronized data. On the other hand, if either or both of the first clock value and the second clock value indicate the second logical value, then the time at which the first clock signal switches from the first logical value to the second logical value is always a prescribed time or more away from the time at which the second delay clock signal switches from the first logical value to the second logical value. In other words, at this time, the second retrieved data retrieved according to the second delay clock signal has not undergone metastability, and thus, data attained by synchronizing the second retrieved data, which was retrieved according to the second delay clock signal, to the second clock signal is outputted as synchronized data.

In the invention, it is determined which of the first retrieved data and the second retrieved data has not undergone metastability on the basis of the value of the first clock signal (first clock value) when the second clock signal switches from the first logical value to the second logical value, and the value of the first clock signal (second clock value) when the first delay clock signal switches from the first logical value to the second logical value. As a result, it is possible to acquire the first and second clock values whether the frequency of the first clock signal is greater than, less than, or equal to the frequency of the second clock signal. Thus, it is possible to determine which of the first retrieved data and the second retrieved data has not undergone metastability, regardless of the size relationship between the frequency of the first clock signal and the frequency of the second clock signal.

Therefore, according to the invention, it is possible to synchronize data, which was synchronized to the first clock signal, to the second clock signal, which is asynchronous to the first clock signal and at a differing frequency therefrom, without causing defects resulting from metastability.

BRIEF DESCRIPTION OF THE DRAWINGS

FIG. 7 shows a relationship between clock values CL1 to CL3 for each state (a) to (n) and data retrieval results according to CK2, CK2a, and CK2b.

DETAILED DESCRIPTION OF EMBODIMENTS

An embodiment of the invention will be explained in detail below with reference to the drawings.

Figure 1:
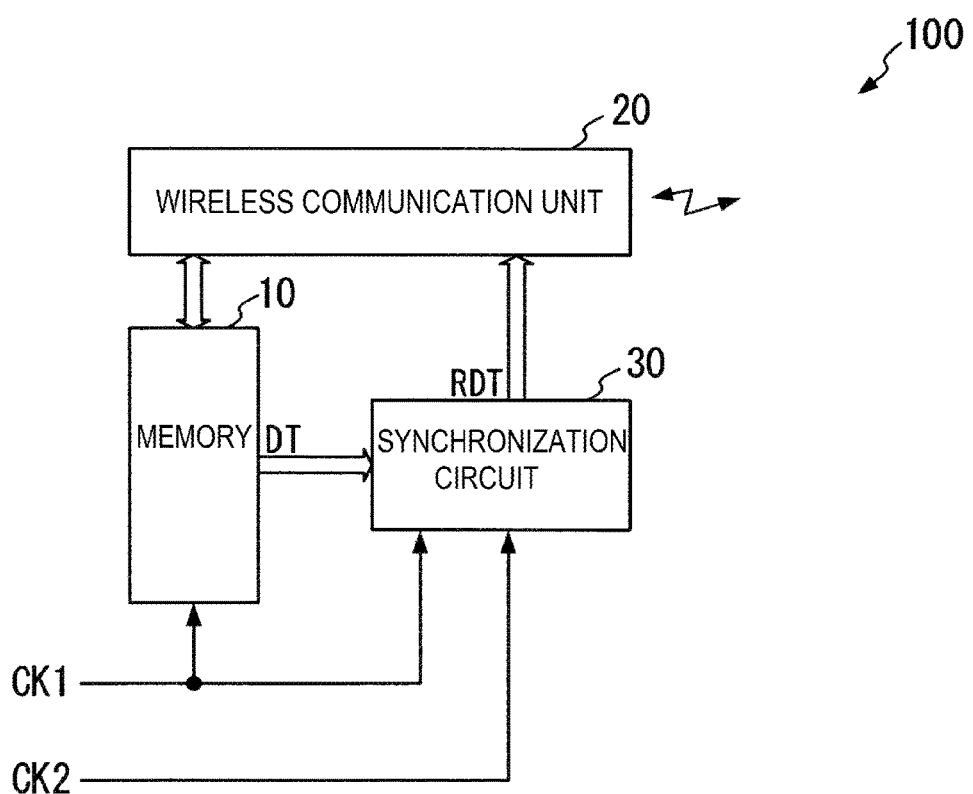
FIG. 1 is a block diagram that schematically shows an internal configuration of a wireless tag 100 including a synchronization circuit 30 as a semiconductor device according to the invention.

FIG. 1 is a block diagram that schematically shows an internal configuration of a wireless tag 100 including a synchronization circuit 20 as a semiconductor device according to the invention. As shown in FIG. 1, the wireless tag 100 includes a memory 10, a wireless communication unit 20, and a synchronization circuit 30. The memory 10, the wireless communication unit 20, and the synchronization circuit 30 are formed onto the same semiconductor chip. Alternatively, the synchronization circuit 30 may be formed on a separate semiconductor chip.

The memory 10 is configured to store identification information identifying the wireless tag 100 itself or 8-bit data, for example, that includes user information or the like pertaining to the user. The memory 10 reads the stored 8-bit data as data DT according to a read command from the wireless communication unit 20, and provides the data DT to the synchronization circuit 30 at a timing synchronized with the rising edge of a memory clock signal CK1. The memory clock signal CK1 is a binary oscillation signal in which a logical value of 0 and a logical value of 1 are repeated alternately.

The synchronization circuit 30 is configured to retrieve the 8-bit data DT at a timing synchronized with a synchronization clock signal CK2, and provides the retrieved data to the wireless communication unit 20 as 8-bit synchronized data RDT. Similar to the memory clock signal CK1, the synchronization clock signal CK2 is also a binary oscillation signal in which a logical value of 0 and a logical value of 1 are repeated alternately. However, the synchronization clock signal CK2 is asynchronous to the memory clock signal CK1, and the frequency of the memory clock signal CK1 differs from the frequency of the synchronization clock signal CK2.

The wireless communication unit 20 is configured to wirelessly transmit the synchronized data RDT by performing a prescribed modulation process on the synchronized data.

Figure 2:
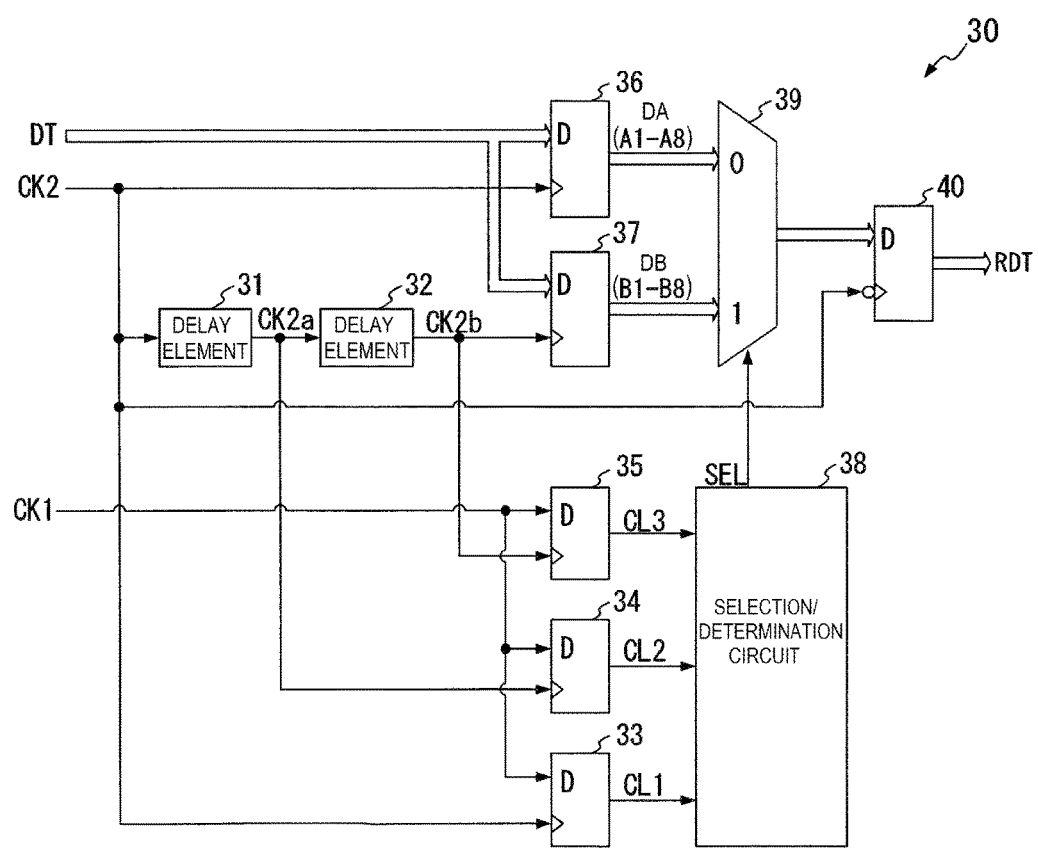
FIG. 2 is a circuit diagram showing an example of an internal configuration of the synchronization circuit 30.

FIG. 2 is a circuit diagram showing an example of an internal configuration of the synchronization circuit 30. As shown in FIG. 2, the synchronization circuit 30 has delay elements 31 and 32, FFs 33 to 35 that are 1-bit D-type flip-flops, FFs 36 and 37 that are 8-bit D-type flip-flops, a selection/determination circuit 38, a selector 39, and an FF 40 that is an 8-bit D-type flip-flop. The FFs 33 to 37 and 40 are edge triggered flip-flops that are configured to retrieve data at the rising edge of the clock signal, and as shown in FIG. 3, a setup time $T_{ST}$ and a hold time $T_{HD}$ are defined therein.

Figures 4, 5:
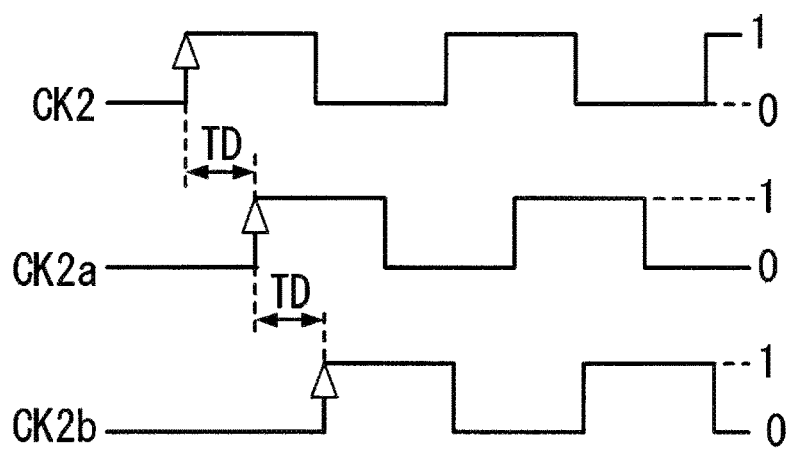
FIG. 4 is a time chart showing one example of a synchronization clock signal CK2, and delayed synchronization clock signals CK2a and CK2b.
FIG. 5 shows an operation of a selection/determination circuit 38.

As shown in FIG. 4, the delay element 31 is configured to generate, as the delayed synchronization clock signal CK2a, a signal that is delayed by a prescribed time (a first delay time) TD from the synchronization clock signal CK2, and provide this to the delay element 32 and the clock terminal of the FF 34.

As shown in FIG. 4, the delay element 32 generates, as the delayed synchronization clock signal CK2b, a signal that is delayed by the above-mentioned prescribed time (second delay time) TD from the delayed synchronization clock signal CK2a, and provides this to the clock terminals of the FFs 35 and 37.

Figure 3:
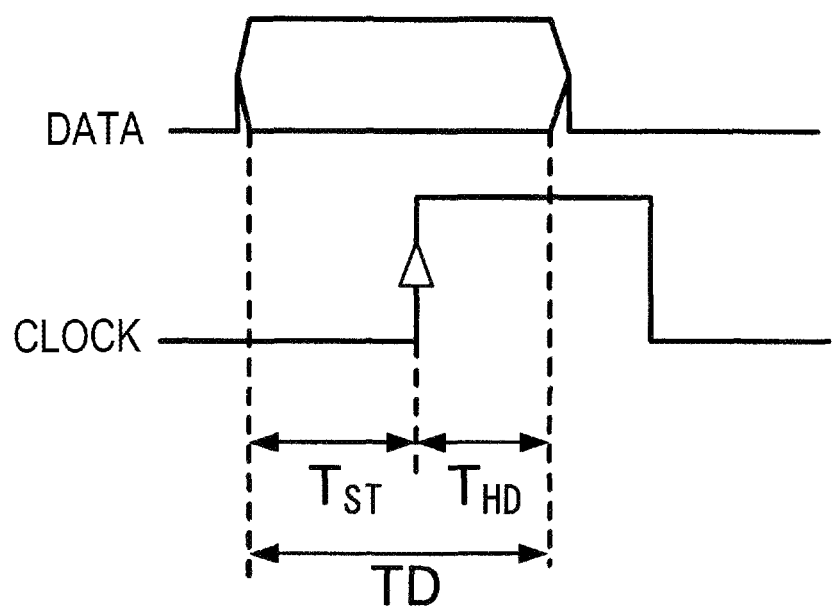
FIG. 3 shows a relationship between the clock signal and data inputted to a flip-flop, and a setup time and hold time.

The prescribed time TD has a length attained by adding the hold time $T_{HD}$ to the setup time $T_{ST}$ shown in FIG. 3, for example.

The FF 33 receives through the clock terminal thereof the synchronization clock signal CK2, and receives the memory clock signal CK1 through the data terminal. The FF 33 retrieves the value of the memory clock signal CK1 (logical value of 0 or 1) at the rising edge of the synchronization clock signal CK2, and provides to the selection/determination circuit 38 a clock value CL1 representing the aforementioned value.

The FF 34 receives through the clock terminal thereof the delayed synchronization clock signal CK2a, and receives the memory clock signal CK1 through the data terminal. The FF 34 retrieves the value of the memory clock signal CK1 (logical value of 0 or 1) at the rising edge of the delayed synchronization clock signal CK2a, and provides to the selection/determination circuit 38 a clock value CL2 representing the aforementioned value.

The FF 35 receives through the clock terminal thereof the delayed synchronization clock signal CK2b, and receives the memory clock signal CK1 through the data terminal. The FF 35 retrieves the value of the memory clock signal CK1 (logical value of 0 or 1) at the rising edge of the delayed synchronization clock signal CK2b, and provides to the selection/determination circuit 38 a clock value CL3 representing the aforementioned value.

The FF 36 receives through the clock terminal thereof the synchronization clock signal CK2, and receives the data DT through the data terminal. As described previously, the data DT is 8-bit data read in from the memory 10 at a timing synchronized with the memory clock signal CK1. The FF 36 retrieves an 8-bit logical value (the 8-bit logical value will hereinafter be referred to as the "data value") represented in the data DT at the rising edge of the synchronization clock signal CK2. The FF 36 provides to the selector 39 the 8-bit retrieved data DA representing the retrieved data value.

The FF 37 receives through the clock terminal thereof the delayed synchronization clock signal CK2b, and receives the data DT through the data terminal. The FF 37 retrieves a data value represented in the data DT at the rising edge of the delayed synchronization clock signal CK2b. The FF 37 provides to the selector 39 the 8-bit retrieved data DB representing the retrieved data value.

The selection/determination circuit 38 is configured to determine which of the retrieved data DA or DB has not undergone metastability on the basis of the clock values CL1 to CL3. The selection/determination circuit 38 provides to the selector 39 a selection signal SEL for selecting data that has not undergone metastability on the basis of the determination results.

As shown in FIG. 5, for example, the selection/determination circuit 38 determines that the retrieved data DA has not undergone metastability if, among the clock values CL1 to CL3, both CL1 and CL2 have a logical value of 0. At this time, the selection/determination circuit 38 supplies to the selector 39 a selection signal SEL with a logical value of 0 for selecting the retrieved data DA. On the other hand, the selection/determination circuit 38 determines that the retrieved data DB has not undergone metastability if one or both of the clock values CL1 and CL2 have a logical value of 1. At this time, the selection/determination circuit 38 supplies to the selector 39 a selection signal SEL with a logical value of 1 for selecting the retrieved data DB.

The selector 39 is configured to receive the retrieved data DA and the retrieved data DB, and if the selection signal SEL has a logical value of 0, then it selects the retrieved data DA and provides it to the FF 40. On the other hand, if the selection signal SEL has a logical value of 1, the selector 39 selects the retrieved data DB, among the retrieved data DA and DB, and provides it to the FF 40.

The FF 40 retrieves the data value represented by the retrieved data DA or the data value represented by the retrieved data DB provided from the selector 39, at the falling edge of the synchronization clock signal CK2. The FF 40 outputs the synchronized data RDT representing the retrieved data value.

Below, the defect prevention operation for defects resulting from metastability in the synchronization circuit 30 according to the above configuration will be described.

The synchronization circuit 30 includes delay elements 31 and 32, FFs 33 to 35, and a selection/determination circuit 38 in order to determine which of the retrieved data DA and the retrieved data DB has not undergone metastability.

Here, the timing at which the value of the data DT switches from a logical value of 0 to 1 or vice versa is always the rising edge of the memory clock signal CK1. Thus, the range from the time that is ahead, by the hold time $T_{HD}$, of the rising edge of the memory clock signal CK1, to the time that is after the rising edge by the setup time $T_{ST}$ is a metastability occurrence interval during which there is a high probability of metastability occurring. The interval may be set as a period for checking the metastable state occurs.

The FFs 33 to 35 retrieve the value of the memory clock signal CK1 at the three points of CK2, CK2a, and CK2b.

Figure 6:
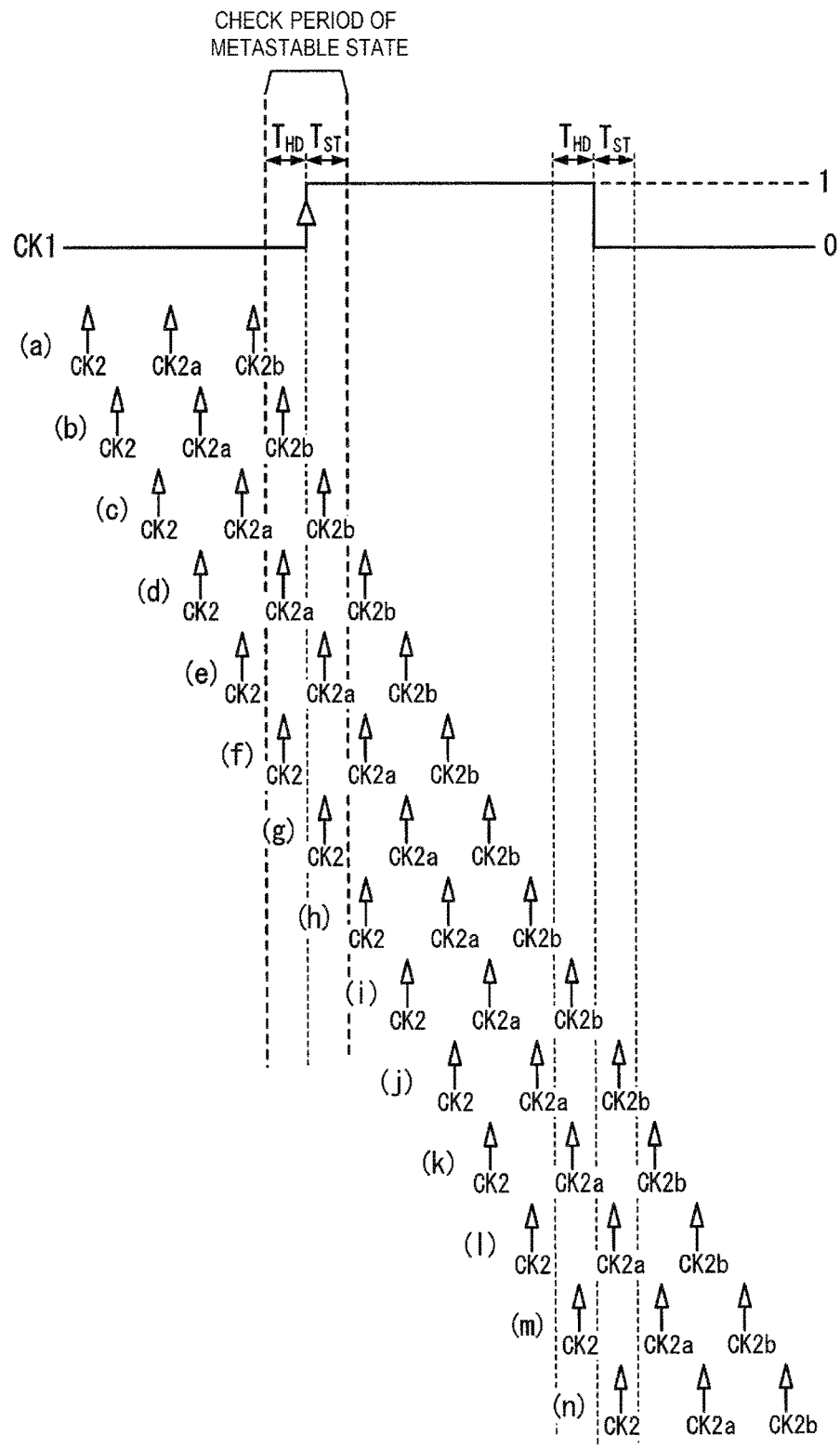
FIG. 6 shows positional relationships between rising edges of memory clock signals CK1, CK2, CK2a, and CK2b.

The memory clock signal CK1 and the synchronization clock signal CK2 are asynchronous to each other, and thus, the positional relationship between rising edges of the memory clock signals CK1, CK2, CK2a, and CK2b is indicated as 14 states (a) to (n) as shown in FIG. 6.

Thus, for the state (a) shown in FIG. 6, the FF 33 retrieves the logical value of 0 of the memory clock signal CK1 at the rising edge of the synchronization clock signal CK2, and as shown in FIG. 7 outputs the clock value CL1 indicating the logical value of 0, for example. Also, for the state (a), the FF 34 retrieves the logical value of 0 of the memory clock signal CK1 at the rising edge of the delayed synchronization clock signal CK2a, and as shown in FIG. 7 outputs the clock value CL2 indicating the logical value of 0. Additionally, for the state (a), the FF 35 retrieves the logical value of 0 of the memory clock signal CK1 at the rising edge of the delayed synchronization clock signal CK2b, and as shown in FIG. 7 outputs the clock value CL3 indicating the logical value of 0.

For the state (b) shown in FIG. 6, the FF 33 retrieves the logical value of 0 of the memory clock signal CK1 at the rising edge of the synchronization clock signal CK2, and as shown in FIG. 7 outputs the clock value CL1 indicating the logical value of 0, for example. Also, for the state (b), the FF 34 retrieves the logical value of 0 of the memory clock signal CK1 at the rising edge of the delayed synchronization clock signal CK2a, and as shown in FIG. 7 outputs the clock value CL2 indicating the logical value of 0. Additionally, for the state (b), the FF 35 retrieves the logical value of 0 of the memory clock signal CK1 at the rising edge of the delayed synchronization clock signal CK2b, and as shown in FIG. 7 outputs the clock value CL3 indicating the logical value of 0. However, the rising edge of the delayed synchronization clock signal CK2b is, as shown in FIG. 6, ahead of the rising edge of the memory clock signal CK1 (level change time), and is separated from the rising edge by the hold time $T_{HD}$ or greater. Thus, in this case, there is a high probability that metastability has occurred, and thus, in the state (b) shown in FIG. 6, the logical value retrieved by the FF 35 is 0, but is in fact an uncertain value that might also be 1.

For the state (c) shown in FIG. 6, the FF 33 retrieves the logical value of 0 of the memory clock signal CK1 at the rising edge of the synchronization clock signal CK2, and outputs the clock value CL1 indicating the logical value of 0, for example. Also, for the state (c), the FF 34 retrieves the logical value of 0 of the memory clock signal CK1 at the rising edge of the delayed synchronization clock signal CK2a, and outputs the clock value CL2 indicating the logical value of 0. Additionally, for the state (c), the FF 35 retrieves the logical value of 1 of the memory clock signal CK1 at the rising edge of the delayed synchronization clock signal CK2b, and outputs the clock value CL3 indicating the logical value of 0. However, the rising edge of the delayed synchronization clock signal CK2b is, as shown in FIG. 6, after the rising edge of the memory clock signal CK1, and is separated from the rising edge by the setup time $T_{ST}$ or greater. Thus, in this case, there is a high probability that metastability has occurred, and thus, in the state (c) shown in FIG. 6, the logical value retrieved by the FF 35 is 1, but is in fact an uncertain value that might also be 0.

FIG. 7 shows the clock values CL1 to CL3 outputted by the FFs 33 to 35 for each state (a) to (n) shown in FIG. 6. As shown in FIG. 4, the rising edge of the delayed synchronization clock signal CK2a is delayed by the prescribed time TD from the rising edge of the synchronization clock signal CK2, and the rising edge of the delayed synchronization clock signal CK2b is delayed by the prescribed time TD from the rising edge of the delayed synchronization clock signal CK2a. Here, the prescribed time TD has a length attained by adding the hold time $T_{HD}$ to the setup time $T_{ST}$ of the FF as previously described. As a result, if, among the clock values CL1 to CL3 retrieved at the three times of the rising edges of CK2, CK2a, and CK2b, one of the clock values is an uncertain value, then the other two are always normal values. In FIG. 7, "1(0)" and "0(1)" indicate uncertain values, whereas "0" and "1" indicate normal values.

Here, if the data DT were retrieved at the above-mentioned three times (CK2, CK2a, and CK2b), then the result of retrieving those values (retrieval of normal value or uncertain value) is as shown in FIG. 7 for each state (a) to (n). In FIG. 7, retrieval of a normal value is indicated by a white circle and retrieval of an uncertain value is indicated by a black circle.

At this time, as shown in FIG. 7, if both the clock values CL1 and CL2 have a logical value of 0, that is, in the case of the states (a) to (d) and (n), the data DT is always retrieved as a normal value by the synchronization clock signal CK2 as shown in the region encircled by the broken lines. The selection/determination circuit 38 determines that the retrieved data DA outputted from the FF 36 is data in which metastability has not occurred. The selection/determination circuit 38 supplies to the selector 39 a selection signal SEL with a logical value of 0 for selecting the retrieved data DA. As a result, the selector 39 supplies the retrieved data DA to the FF 40. The FF 40 retrieves the retrieved data DA provided through the selector 39 at the falling edge of the synchronization clock signal CK2, and outputs the retrieved data DA as the synchronized data RDT.

In the above-mentioned example, the data DT is a signal synchronized with the rising edge of the memory clock signal CK1. Thus, the value of the data DT does not change at the falling edge of the memory clock signal CK1. In other words, as shown in FIG. 6, the interval from the time that is ahead, by the hold time $T_{HD}$, of the time of the rising edge of the memory clock signal CK1, to the time that is after the rising edge of CK1 by the setup time $T_{ST}$ is a metastability occurrence interval. On the other hand, in the vicinity of the falling edge of the memory clock signal CK1, there is no metastability occurrence interval. Thus, as shown in FIG. 7, in states (i) to (n), even if one of the clock values CL1 to CL3 were an uncertain value, normal values would be retrieved for all three above-mentioned times (CK2, CK2a, CK2b).

Thus, if one or both of the clock values CL1 and CL2 have a logical value of 1, that is, in the case of the states (e) to (m), the data DT can be retrieved as a normal value by the delayed synchronization clock signal CK2b as shown in the region encircled by the one-dot chain line. At this time, the selection/determination circuit 38 determines that the retrieved data DB outputted from the FF 37 is data in which metastability has not occurred. The selection/determination circuit 38 supplies to the selector 39 a selection signal SEL with a logical value of 1 for selecting the retrieved data DB. As a result, the selector 39 supplies the retrieved data DB to the FF 40. The FF 40 retrieves the retrieved data DB provided through the selector 39 at the falling edge of the synchronization clock signal CK2, and outputs the retrieved data DB as the synchronized data RDT.

Figure 8:
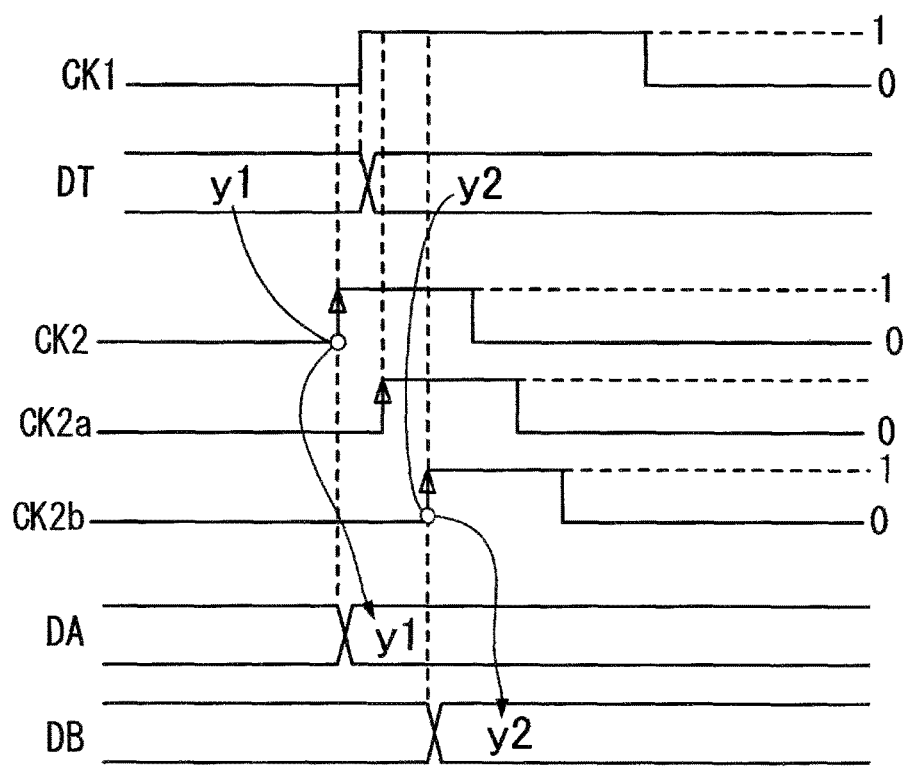
FIG. 8 is a time chart showing an example of an internal operation in the synchronization circuit 30.

FIG. 8 is a time chart showing an example of an operation in the synchronization circuit 30 shown in FIG. 2. In the example shown in FIG. 8, the data value represented by the data DT transitions from the data value "y1" to the data value "y2" at the rising edge of the memory clock signal CK1. Also, in the example shown in FIG. 8, the positional relationship between rising edges of memory clock signals CK1, CK2, CK2a, and CK2b is the state (e) shown in FIG. 6. At this time, when the data DT is received, the FF 36 of the synchronization circuit 30 retrieves the data value "y1" represented in the data DT at the rising edge of the delayed synchronization clock signal CK2, and supplies the retrieved data DA indicating the data value "y1" to the selector 39. The FF 37 of the synchronization circuit 30 retrieves the data value "y2" represented in the data DT at the rising edge of the delayed synchronization clock signal CK2b, and supplies the retrieved data DB indicating the data value "y2" to the selector 39.

The FF 33 retrieves the logical value of 0 of the memory clock signal CK1 at the rising edge of the synchronization clock signal CK2, and provides to the selection/determination circuit 38 a clock value CL1 representing the logical value of 0. The FF 34 retrieves the logical value of 1 of the memory clock signal CK1 at the rising edge of the delayed synchronization clock signal CK2a, and provides to the selection/determination circuit 38 a clock value CL2 representing the logical value of 1. The FF 35 retrieves the logical value of 1 of the memory clock signal CK1 at the rising edge of the delayed synchronization clock signal CK2a, and provides to the selection/determination circuit 38 a clock value CL3 representing the logical value of 1. Thus, as shown in FIG. 5, the selection/determination circuit 38 supplies to the selector 39 the selection signal SEL indicating a logical value of 1 on the basis of the clock value CL1 indicating a logical value of 0 and the clock values CL2 and CL3 indicating a logical value of 1. As a result, the selector 39 supplies the retrieved data DB indicating the data value "y2" to the FF 40. The FF 40 retrieves the retrieved data DB indicating the data value "y2" at the falling edge of the synchronization clock signal CK2, and outputs the synchronized data RDT indicating the data value "y2".

Also, in the example shown in FIG. 8, the positional relationship between rising edges of memory clock signals CK1, CK2, CK2a, and CK2b is the state (e) shown in FIG. 6, but if, for example, the positional relationship is in the state (c) shown in FIG. 6, then the selection/determination circuit 38 supplies to the selector 39 the selection signal SEL indicating a logical value of 0. As a result, the selector 39 supplies the retrieved data DA indicating the data value "y1" to the FF 40.

As a result, in the synchronization circuit 30, even if the rising edges of the memory clock signal CK1 and the synchronization clock signal CK2 overlap, whichever of the data value (y1) and the data value (y2) has not been affected by metastability is synchronized with the synchronization clock signal CK2. Thus, with use of the synchronization circuit 30, it is possible to guarantee that the data value indicated by the synchronized data RDT does not include an uncertain value resulting from metastability.

Also, in the synchronization circuit 30, even if metastability were to occur in one of the FFs 36 and 37 retrieving the data DT, the data value indicated by the synchronized data RDT is the data value (y1) immediately prior to the rising edge of the memory clock signal CK1 or the data value (y2) immediately following the rising edge. Thus, a defect in which metastability causes the upper bit of 8-bit data to change from a logical value of 0 to 1 or vice versa and greatly affect the data value would not occur, for example. As a result, the data value represented by the synchronized data RDT does not become an unusable uncertain value, and thus, there is no need to provide a circuit for determining the validity of data in a latter stage device using the synchronized data RDT.

In the selection/determination circuit 30, it is determined which of the data (DA) retrieved at CK2 or data (DB) retrieved at CK2b has not undergone metastability on the basis of the clock values CL1 and CL2 attained by retrieving the memory clock signal CK1 at two times (CK2, CK2a). At this time, CK2a is attained by delaying CK2 by an amount of time equal to the prescribed time TD calculated by adding the hold time ($T_{HD}$) and the setup time ($T_{ST}$) of the FF.

Therefore, it is possible to acquire the clock values CL1 and CL2 whether the frequency of the memory clock signal CK1 is greater than, less than, or equal to the frequency of the synchronization clock signal CK2. Thus, it is possible to determine which of the data (DA) retrieved at the synchronization clock signal CK2 or data (DB) retrieved at CK2b has not undergone metastability without relying on the frequencies of the memory clock signal CK1 and the synchronization clock signal CK2.

Furthermore, even when the data (DB) retrieved at CK2b is selected, the delay time from the rising edge of the synchronization clock signal CK2 is only $2 \cdot (T_{ST}+T_{HD})$, and thus, it is possible to mitigate output delay in the synchronization circuit 30.

As described above, according to the synchronization circuit 30, it is possible to synchronize the 8-bit data DT, which was synchronized with the memory clock signal CK1, with the synchronization clock signal CK2, which is asynchronous to the memory clock signal CK1 and has a differing frequency thereto, without generating an uncertain data value resulting from metastability and while suppressing output delay.

In the above embodiment, the FF 40 retrieves the retrieved data DA or the retrieved data DB provided from the selector 39 at the falling edge of the synchronization clock signal CK2, and outputs the retrieved data DA or DB as the synchronized data RDT. However, the FF 40 may retrieve the data (DA or DB) provided from the selector 39 at the rising edge of the synchronization clock signal CK2, and output the data as the synchronized data RDT.

Also, in the above embodiment, the synchronization circuit 30 synchronizes the 8-bit data DT, read in from the memory 10 in synchronization with the memory clock signal CK1, with the synchronization clock signal CK2. However, the data to be synchronized is not limited to data read from the memory, and the number of bits of the data is not limited to 8.

In the above embodiment, the delay time at each of the delay elements 31 and 32, that is, the prescribed time TD is calculated as a time in which the setup time $T_{ST}$ of the FF is added to the hold time $T_{HD}$ ($T_{ST}+T_{HD}$), but the setup time $T_{ST}$ alone may be the prescribed time TD. The prescribed time TD may be calculated by adding a prescribed margin to the time ($T_{ST}+T_{HD}$) or multiplying the time ($T_{ST}+T_{HD}$) by t (t being an integer of 1 or greater); that is, the prescribed time TD may be greater than or equal to the time ($T_{ST}+T_{HD}$).

Also, in the above embodiment, the FFs 33 to 37 may be so-called positive edge-triggered flip-flops in which data is retrieved at the rising edge timing of the clock signal, that is, when the value of the clock signal switches from a logical value of 0 to a logical value of 1. Alternatively, the FFs 33 to 37 may be so-called negative edge-triggered flip-flops in which data is retrieved at the falling edge timing of the clock signal, that is, when the value of the clock signal switches from a logical value of 1 to a logical value of 0.

Also, in the embodiment shown in FIG. 2, flip-flops are used for the FFs 33 to 37, but as long as elements are used therefor that can perform a synchronized retrieval operation in which data is retrieved and outputted in synchronization with an inputted clock signal, the FFs are not limited to being flip-flops. Additionally, the selection/determination circuit 38, the selector 39, and the FF 40 shown in FIG. 2 may be constituted of one block.

Essentially, the synchronization circuit (30), which synchronizes the input data (DT), which was synchronized to the first clock signal (CK1) in which first and second logical values (0, 1) are repeated alternately, to the second clock signal (CK2) in which the first and second logical values are alternately repeated, may have any configuration as long as the synchronization circuit has a clock delay circuit, first and second synchronized retrieval circuits, a clock value retrieval circuit, and an output circuit. The clock delay circuits (31, 32) generate a signal formed by delaying the second clock signal by a prescribed time ($T_{ST}+T_{HD}$) as the first delay clock signal (CK2a), and generates a signal formed by delaying the first delay clock signal by a prescribed time as the second delay clock signal (CK2b). The first synchronized retrieval circuit (36) retrieves the input data at the timing when the second clock signal switches from the first logical value (0, for example) to the second logical value (1, for example) as the first retrieved data (DA). The second synchronized retrieval circuit (37) retrieves the input data at the timing when the second delay clock signal switches from the first logical value (0, for example) to the second logical value (1, for example) as the second retrieved data (DB). The clock value retrieval circuits (33, 34) retrieve the value of the first clock signal when the second clock signal switches from the first logical value to the second logical value as a first clock value (CL1), and retrieve the value of the first clock signal when the first delay clock signal switches from the first logical value to the second logical value as a second clock value (CL2). If the first clock value and the second clock value are both the first logical value (0, for example), the output circuits (38-40) output data attained by synchronizing the first retrieved data (DA) to the second clock signal as the synchronized data (RDT). On the other hand, if one or both of the first clock value and the second clock value are the second logical value, the output circuits output data attained by synchronizing the second retrieved data (DB) to the second clock signal as the synchronized data (RDT).

What is claimed is:

1. A semiconductor device configured to receive input data synchronized with a first clock signal, and generate output data synchronized with a second clock signal, each of the first clock signal and the second clock signal having a first logical value and a second logical value alternately repeated, the semiconductor device comprising:
    a clock delay circuit configured to generate
        a first delay clock signal by delaying the second clock signal by a first delay time, the first delay clock signal having the first logical value and the second logical value alternately repeated, and
        a second delay clock signal by delaying the first delay clock signal by a second delay time, the second delay clock signal having the first logical value and the second logical value alternately repeated,
    a first synchronized retrieval circuit configured to retrieve the input data at a timing when a value of the second clock signal switches from the first logical value to the second logical value, to thereby obtain first retrieved data;
    a second synchronized retrieval circuit configured to retrieve the input data at a timing when a value of the second delay clock signal switches from the first logical value to the second logical value, to thereby obtain second retrieved data;
    a clock value retrieval circuit configured to retrieve
        a value of the first clock signal at a timing when the second clock signal switches from the first logical value to the second logical value, to thereby output a first clock value, and
        a value of the first clock signal at a timing when the first delay clock signal switches from the first logical value to the second logical value, to thereby output a second clock value; and
    an output circuit configured to output, as the output data that is synchronized with the second clock signal,
        the first retrieved data when the first clock value and the second clock value are both the first logical value, and
        the second retrieved data when at least one of the first clock value and the second clock value is the second logical value.

2. The semiconductor device according to claim 1, wherein the first clock signal is asynchronous to the second clock signal, and has a frequency different from that of the second clock signal.

3. The semiconductor device according to claim 2, wherein the first clock signal is asynchronous to the second clock signal, and has a frequency different from that of the second clock signal.

4. The semiconductor device according to claim 2, wherein the output circuit includes:
    a selector configured to select one of the first retrieved data and the second retrieved data;
    a selection and determination circuit configured to control the selector so as to select the first retrieved data when the first clock value and the second clock value are both the first logical value, and select the second retrieved data when at least one of the first clock value and the second clock value is the second logical value; and an output and retrieval circuit configured to output the output data at a timing when the second clock signal switches from the second logical value to the first logical value of, one of the first retrieved data and the second retrieved data selected by the selector.

5. The semiconductor device according to claim 1, wherein each of the first synchronized retrieval circuit and the second synchronized retrieval circuit includes a flip-flop, and each of the first delay time and second delay time is equal to or greater than a sum of a setup time and a hold time of the flip-flop.

6. The semiconductor device according to claim 5, wherein the output circuit includes:

a selector configured to select one of the first retrieved data and the second retrieved data;

a selection and determination circuit configured to control the selector so as to select the first retrieved data when the first clock value and the second clock value are both the first logical value, and select the second retrieved data when at least one of the first clock value and the second clock value is the second logical value; and an output and retrieval circuit configured to output the output data at a timing when the second clock signal switches from the second logical value to the first logical value of, one of the first retrieved data and the second retrieved data selected by the selector.

7. The semiconductor device according to claim 1, wherein an amount of the first delay time is same as an amount of the second delay time.

8. The semiconductor device according to claim 1, wherein the output circuit includes:

a selector configured to select one of the first retrieved data and the second retrieved data;

a selection and determination circuit configured to control the selector so as to select the first retrieved data when the first clock value and the second clock value are both the first logical value, and select the second retrieved data when at least one of the first clock value and the second clock value is the second logical value; and an output and retrieval circuit configured to output the output data at a timing when a value of the second clock signal switches from the second logical value to the first logical value, one of the first retrieved data and the second retrieved data selected by the selector.

9. A semiconductor device configured to receive input data synchronized with a first clock signal, and generate output data synchronized with a second clock signal, each of the first clock signal and the second clock signal having a first logical value and a second logical value alternately repeated, the semiconductor device comprising:

a clock delay circuit configured to generate a first delay clock signal by delaying the second clock signal by a first delay time, the first delay clock signal having the first logical value and the second logical value alternately repeated, and a second delay clock signal by delaying the first delay clock signal by a second delay time, the second delay clock signal having the first logical value and the second logical value alternately repeated, a first synchronized retrieval circuit configured to retrieve the input data at a timing when a value of the second clock signal switches from the first logical value to the second logical value, to thereby obtain first retrieved data;

a second synchronized retrieval circuit configured to retrieve the input data at a timing when a value of the second delay clock signal switches from the first logical value to the second logical value, to thereby obtain second retrieved data;

a clock value retrieval circuit configured to retrieve a value of the first clock signal at a timing when the second clock signal switches from the first logical value to the second logical value, to thereby output a first clock value, and a value of the first clock signal at a timing when the first delay clock signal switches from the first logical value to the second logical value, to thereby output a second clock value; and an output circuit configured to output, as the output data that is synchronized with the second clock signal, one of the first retrieved data and the second retrieved data, depending on values of the first clock value and the second clock value.

10. A data synchronization method for synchronizing input data, which is synchronized with a first clock signal, to a second clock signal, each of the first clock signal and the second clock signal having a first logical value and a second logical value alternately repeated, the method comprising:

generating a first delay clock signal by delaying the second clock signal by a first delay time, and generating a second delay clock signal by delaying the first delay clock signal by a second delay time, each of the first delayed clock signal and the second delayed clock signal having the first logical value and the second logical value that are alternately repeated;

retrieving the input data at a timing when the second clock signal switches from the first logical value to the second logical value, to thereby obtain first retrieved data;

retrieving the input data at a timing when the second delay clock signal switches from the first logical value to the second logical value, to thereby obtain second retrieved data;

attaining a value of the first clock signal at a timing when the second clock signal switches from the first logical value to the second logical value, to thereby obtain a first clock value;

attaining a value of the first clock signal at a timing when the first delay clock signal switches from the first logical value to the second logical value, to thereby obtain a second clock value; and outputting, as the synchronized data that is synchronized with the second clock signal, the first retrieved data when the first clock value and the second clock value are both the first logical value, and the second retrieved data when at least one of the first clock value and the second clock value is the second logical value.

* * * * *